(12) United States Patent
Sato (10) Patent No.: US 8,148,820 B2
(45) Date of Patent: Apr. 3, 2012

(54) FORMED PRODUCT OF LINE-STRUCTURED SUBSTANCE COMPOSED OF CARBON ELEMENT, AND METHOD OF FORMING THE SAME

(75) Inventor: Shintaro Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 438 days.

(21) Appl. No.: 11/024,756

(22) Filed: Dec. 30, 2004

(65) Prior Publication Data

US 2006/0045836 A1    Mar. 2, 2006

(30) Foreign Application Priority Data

Aug. 31, 2004    (JP) .................................. 2004-252751

(51) Int. Cl.
*H01L 23/48* (2006.01)
*H01L 23/52* (2006.01)
*H01L 29/40* (2006.01)

(52) U.S. Cl. .................. 257/746; 257/758; 257/E51.04; 257/E23.145; 438/780

(58) Field of Classification Search .............. 438/618, 438/622, 629, 652, 780; 257/E51.043, 746, 257/758, E51.04, E23.145; 313/311; 117/68; 423/447.3; 977/742, 775
See application file for complete search history.

(56) References Cited

U.S. PATENT DOCUMENTS

| | | | | |
|---|---|---|---|---|
| 5,707,916 A | * | 1/1998 | Snyder et al. ................. | 502/180 |
| 6,297,063 B1 | * | 10/2001 | Brown et al. .................... | 438/2 |
| 6,413,487 B1 | * | 7/2002 | Resasco et al. ............ | 423/447.3 |
| 6,445,006 B1 | * | 9/2002 | Brandes et al. ................. | 257/76 |
| 6,825,595 B2 | * | 11/2004 | Jin et al. ......................... | 313/311 |
| 6,897,603 B2 | * | 5/2005 | Mao et al. ....................... | 313/311 |
| 7,034,444 B2 | * | 4/2006 | Tsukamoto ..................... | 313/309 |
| 7,074,105 B2 | * | 7/2006 | Kawate et al. ................... | 445/51 |
| 7,518,247 B2 | * | 4/2009 | Sakamoto et al. ............ | 257/773 |
| 2002/0031465 A1 | * | 3/2002 | Saito ......................... | 423/445 B |
| 2002/0179564 A1 | * | 12/2002 | Geobegan et al. ................. | 216/7 |
| 2003/0039750 A1 | * | 2/2003 | Mao et al. ....................... | 427/180 |
| 2003/0042226 A1 | * | 3/2003 | Coll et al. ......................... | 216/41 |
| 2003/0048056 A1 | * | 3/2003 | Kitamura et al. ............. | 313/311 |
| 2003/0082093 A1 | * | 5/2003 | Bang et al. ................. | 423/447.2 |

(Continued)

FOREIGN PATENT DOCUMENTS

JP    2004026532    1/2004

(Continued)

OTHER PUBLICATIONS

Sun, Growth of straight nanotubes with a cobalt-nickel catalyst by chemical vapor deposition, Applied Physics Letters, vol. 74, No. 5, pp. 644-646.*

(Continued)

*Primary Examiner* — Matthew Landau
*Assistant Examiner* — Latanya N Crawford
(74) *Attorney, Agent, or Firm* — Kratz, Quintos & Hanson, LLP (57) ABSTRACT

The present invention proposes a method of readily and reliably forming CNTs independent of a substrate allowing a catalyst metal to deposit thereon, or an underlying material, even for the case where the substrate is not used, in which a titanium-cobalt composite particles are deposited, using a catalyst particle production system, on an insulating film formed on a silicon substrate, and CNTs are grown from the from titanium-cobalt composite particles by the CVD process.

9 Claims, 7 Drawing Sheets
(5 of 7 Drawing Sheet(s) Filed in Color)

U.S. PATENT DOCUMENTS

| | | | |
|---|---|---|---|
| 2003/0108480 A1* | 6/2003 | Baker et al. | 423/447.3 |
| 2003/0211724 A1* | 11/2003 | Haase | 438/629 |
| 2003/0215376 A1* | 11/2003 | Chopra | 422/942 |
| 2004/0045816 A1* | 3/2004 | Masel et al. | 204/290.14 |
| 2004/0101467 A1* | 5/2004 | Harutyunyan et al. | 423/447.3 |
| 2004/0116034 A1* | 6/2004 | Den et al. | 445/50 |
| 2004/0241080 A1* | 12/2004 | Nagy et al. | 423/447.3 |
| 2004/0263044 A1* | 12/2004 | Yoon et al. | 313/311 |
| 2004/0265210 A1* | 12/2004 | Shinohara et al. | 423/447.3 |
| 2005/0002851 A1* | 1/2005 | McElrath et al. | 423/447.3 |
| 2005/0053826 A1* | 3/2005 | Wang et al. | 429/44 |
| 2005/0089467 A1* | 4/2005 | Grill et al. | 423/447.3 |
| 2005/0112049 A1* | 5/2005 | Hofmeister | 423/447.1 |
| 2005/0112051 A1* | 5/2005 | Liu et al. | 423/447.1 |
| 2006/0024227 A1* | 2/2006 | Maruyama et al. | 423/447.3 |
| 2006/0043861 A1* | 3/2006 | Liu | 313/311 |
| 2006/0091557 A1* | 5/2006 | Sakamoto et al. | 257/774 |
| 2006/0104889 A1* | 5/2006 | Harutyunyan et al. | 423/447.3 |
| 2006/0165988 A1* | 7/2006 | Chiang et al. | 428/402.2 |
| 2006/0198399 A1* | 9/2006 | Jablonski et al. | 372/10 |
| 2006/0254501 A1* | 11/2006 | Wang et al. | 117/68 |
| 2007/0003470 A1* | 1/2007 | Smalley et al. | 423/447.3 |
| 2007/0098622 A1* | 5/2007 | Nakayama et al. | 423/447.3 |
| 2007/0253889 A1* | 11/2007 | Awano et al. | 423/447.3 |
| 2008/0315746 A1* | 12/2008 | Gosain et al. | 313/357 |

FOREIGN PATENT DOCUMENTS

| | | |
|---|---|---|
| JP | 2004131360 | 4/2004 |

OTHER PUBLICATIONS

Sato, Carbon nanotube growth from titanium-cobalt bimetallic particles as a catalyst, Chemical Physics Letters, 402 (2005), pp. 149-154.*

Nihei, M., et al. "Electrical properties of carbon nanotube bundles connected with low-resistance ohmic contact between Ti electrodes;" *51st Meeting of Japan Society of Applied Physics and Related Societies, Texts for Lectures, Tokyo University of Technology*, 28p-ZX-11 (Mar. 2004).

* cited by examiner

FIG. 1

TRANSMISSION ELECTRON MICROSCOPE IMAGE OF
TITANIUM-COBALT COMPOSITE PARTICLE

FIG. 2A

SCANNING ELECTRON MICROSCOPE (SEM) IMAGE OF
CNT GROWN FROM TITANIUM-COBALT COMPOSITE PARTICLE

FIG. 2B

SEM IMAGE OBTAINED AFTER TRIAL OF CNT GROWTH
ON PURE COBALT PARTICLE

FIG. 3

SEM IMAGE OF CNT GROWN FROM TITANIUM-COBALT COMPOSITE PARTICLE (Ti CONTENT=0.6%) ON SILICON

FIG. 4

SEM IMAGE OF CNT GROWN FROM TITANIUM-COBALT COMPOSITE PARTICLE (Ti CONTENT=50%) ON SILICON

FIG. 5

SEM IMAGE OF CNT GROWN FROM TITANIUM-COBALT
COMPOSITE PARTICLE ON Ta FILM

SEM IMAGE OF TITANIUM-COBALT
COMPOSITE PARTICLE DEPOSITED ON SUBSTRATE

FORMED PRODUCT OF LINE-STRUCTURED SUBSTANCE COMPOSED OF CARBON ELEMENT, AND METHOD OF FORMING THE SAME

CROSS-REFERENCE TO RELATED APPLICATIONS

This application is based upon and claims the benefit of priority from the prior Japanese Patent Application No. 2004-252751, filed on Aug. 31, 2004, the entire contents of which are incorporated herein by reference.

BACKGROUND OF THE INVENTION

1. Field of the Invention

The present invention relates to a formed product of a line-structured substance composed of carbon element, which is so-called carbon nanotube, and a method of forming the same.

2. Description of the Related Art

Many trials have been made on carbon nanotube (CNT), which is a carbon-base, self-organizing, line-structured substance, in applications of various fields, by virtue of its excellent electric, thermal and mechanical properties. Methods for growing CNTs include arc discharge process, laser abrasion process and chemical vapor deposition (CVD) process. There is also provided a technique as disclosed in Patent Document 1, by which CNTs are grown on a cobalt-immobilized simple body such as a titanium-containing zeolite or the like. Among these techniques, the CVD process is widely used in particular in electrical applications because the process can grow CNTs directly on a substrate. Techniques for growing CNTs by the CVD process include such as, as disclosed in Patent Document 2 for example, depositing a catalyst metal film on a substrate by the sputtering process or vacuum evaporation process, refining grains of the film typically by annealing, and allowing CNTs to grow thereon, or in some cases such as depositing a preliminarily-refined particles on a substrate and then allowing CNTs to grow thereon.

In general, as disclosed in Non-Patent Document 1, degree of growth of CNTs by the CVD process is very sensitive to the substrate, so that it is often grown after forming not only the catalyst metal film, but also a metal film composed of aluminum (Al) or titanium (Ti), for example, under the catalyst film. The growth per se is proceeded at a substrate temperature of approximately 500° C. to 1,000° C. while introducing a hydrocarbon gas such as methane, acetylene or the like, or alcohol into a film forming chamber.

[Patent Document 1] Japanese Patent Application Laid-Open No. 2004-131360
[Patent Document 2] Japanese Patent Application Laid-Open No. 2004-26532
[Non-Patent Document 1] Nihei et al., 2004 Spring Meeting of The Japan Society of Applied Physics and Related Societies, 28p-ZX-11

The conventional techniques represented by those disclosed in Patent Documents 1 and 2, however, are disadvantageous in that the growth of CNTs strongly depends on the substrate on which the catalyst metal film is formed. It is therefore absolutely impossible to grow CNTs directly on a desired substrate typically for the purpose of fabricating electric devices. Applicable ranges of CNTs are therefore strongly limited, and restricted to an extremely narrow range.

The present invention is conceived after considering the above-described problems, and an object thereof resides in providing a formed product of line-structured substance composed of carbon element and a method of forming the same, both of which are aimed at making it possible to readily and reliably form CNTs independent of the substrate allowing the catalyst metal to deposit thereon, or underlying material, even for the case where the substrate is not used.

SUMMARY OF THE INVENTION

A formed product of a line-structured substance composed of carbon element of the present invention comprises a composite particle containing at least a single species of a first metal as a catalyst metal, and at least a single species of a second metal controlling catalytic action of the first metal; and a line-structured substance composed of carbon element grown from the composite particle.

A method of forming a line-structured substance composed of carbon element of the present invention comprises the steps of forming a composite particle containing at least a single species of a first metal as a catalyst metal, and at least a single species of a second metal controlling catalytic action of the first metal; and forming a line-structured substance composed of carbon element as grown on the composite particle, by subjecting the composite particle to treatment for growth of the line-structured substance.

According to the present invention, it is made possible to readily and reliably form CNTs independent of the substrate allowing the catalyst metal to deposit thereon, or underlying material, even for the case where the substrate is not used.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE PREFERRED EMBODIMENTS

Basic Concept of the Present Invention

Control of catalyst is most essential in CNTs growth by the CVD process, and it remains still unclear and under extensive researches as for what kind of catalyst and which way of use thereof give good results. In particular for the case where the catalyst film is formed by sputtering, thickness of the catalyst film is understood as a very important parameter, and at the same time it is also supposed that presence or absence of a metal film (Al, Ti, etc.) other than the catalyst metal film, thickness thereof, and surface treatment may be important parameters.

For the case where a multi-layered film composed of a metal film and a catalyst film is used for CNTs growth as described in the above, a manner of mixing of the metals in the multi-layered film can vary depending on annealing-temperature and growth temperature. Supposing now that there may be a manner of mixing optimum for CNTs growth, it is considered as necessary to control thickness and so forth of the constituent layers of the multi-layered film depending on the temperature or species of source gases. CNTs growth with the aid of the multi-layered film needs the catalyst metal particles formed, but it is not easy to control the degree of particle formation and manner of mixing of the multi-layered film at the same time.

Assuming now that the multi-layered film is preferable for CNTs growth as described in the above, it may be understood that any substrate which cannot allow the multi-layered film to grow thereon cannot allow also CNTs to grow thereon with a desirable controllability. For example, the method of using the multi-layered film cannot be applied for the case where CNTs are desired to be grown with a sparse density in an electrically isolated portion.

The present inventors considered that requirements for an excellent catalyst allowing CNTs to be grown thereon are such as comprising a plurality of components including a catalyst metal, being controlled in a ratio of the contents thereof, and having the particle form. In pursuit of forming CNTs independent of the substrate allowing the catalyst metal to deposit thereon, or underlying material, the present inventors reached an idea of directly depositing a plurality of component including a catalyst metal, or more specifically a composite particle (multi-element particle) containing a catalyst metal and a metal controlling the catalytic action thereof, in a portion where CNTs will be grown. This makes it possible to independently control ratio of contents of the individual metals contained in the composite particle and degree of the particle formation (size of the composite particle, etc.).

Figure 1:
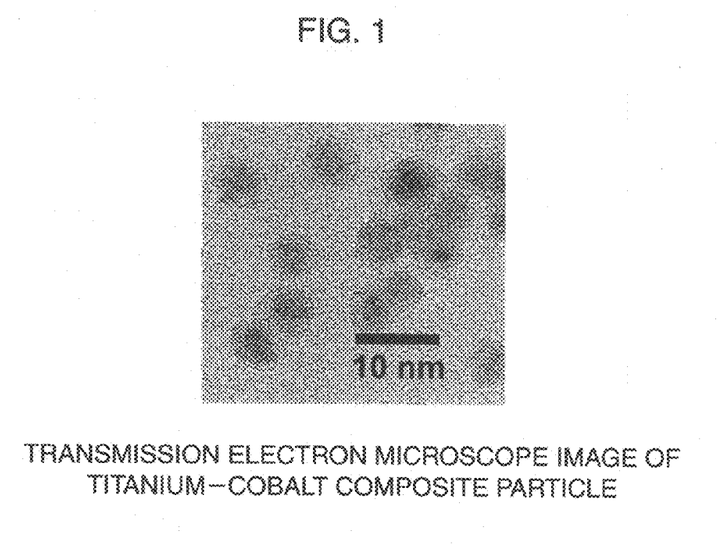
FIG. 1 is a transmission electron microscope (TEM) image of a titanium-cobalt composite particle produced by adjusting content of the second metal to 5%.

More specifically, a titanium-cobalt composite particle is provided as the above-described composite particle, using cobalt (Co) as the catalyst metal (first metal), and titanium (Ti) as a metal (second metal) controlling the catalytic action thereof. FIG. 1 is a transmission electron microscope (TEM) image of the titanium-cobalt composite particle grown on a silicon substrate, produced by adjusting Ti content to 5%. It is found from the image that the titanium-cobalt composite particle is formed with a uniform diameter as small as 5 nm or around.

The growth probability of CNTs can be controlled by adjusting the ratio of Ti content of the titanium-cobalt composite particle. In more detail, the ratio of Ti content is preferably adjusted within a range from 0.5% to 50%, both ends inclusive. The ratio of content exceeding 50% may result in a lowered growth probability of CNTs and degraded quality of the grown CNTs, and the ratio smaller than 0.5% may result in difficulty in CNTs growth.

Figure 2A:
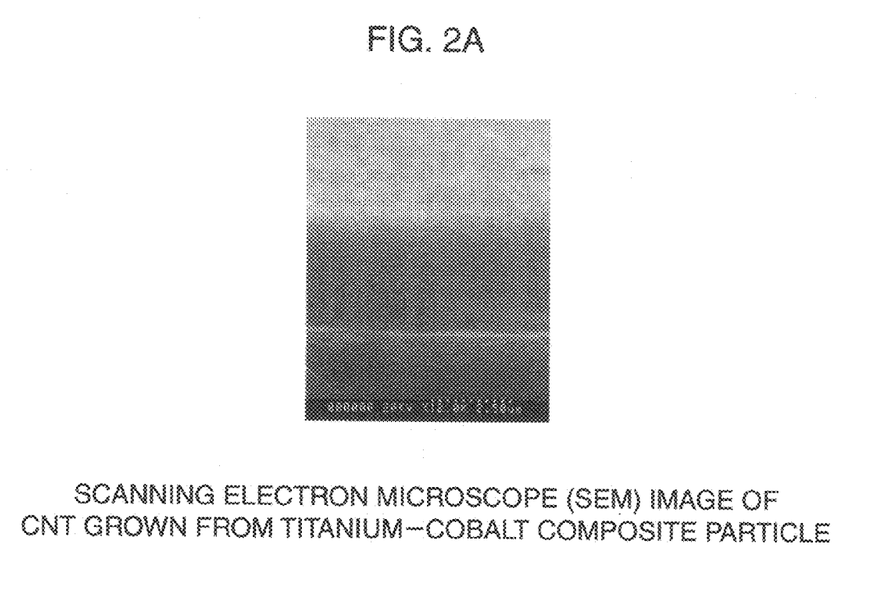
FIGS. 2A and 2B are scanning electron microscope (SEM) images of CNTs grown from a titanium-cobalt composite particle and a pure cobalt fine particle.
Figure 2B:
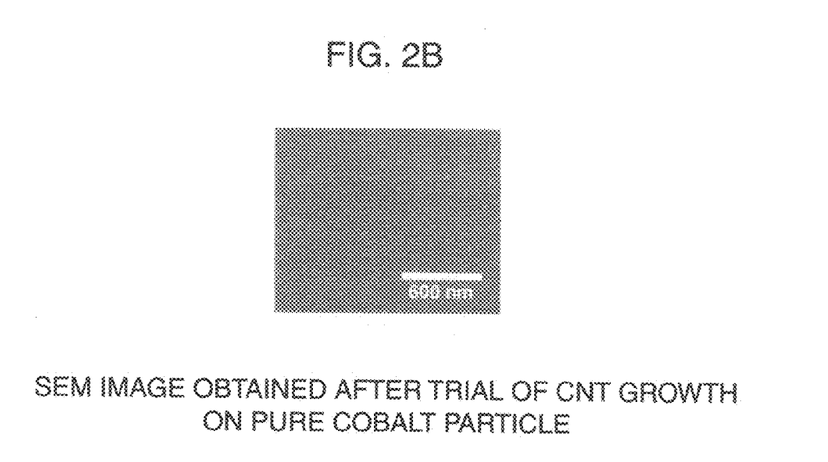
Figure 3:
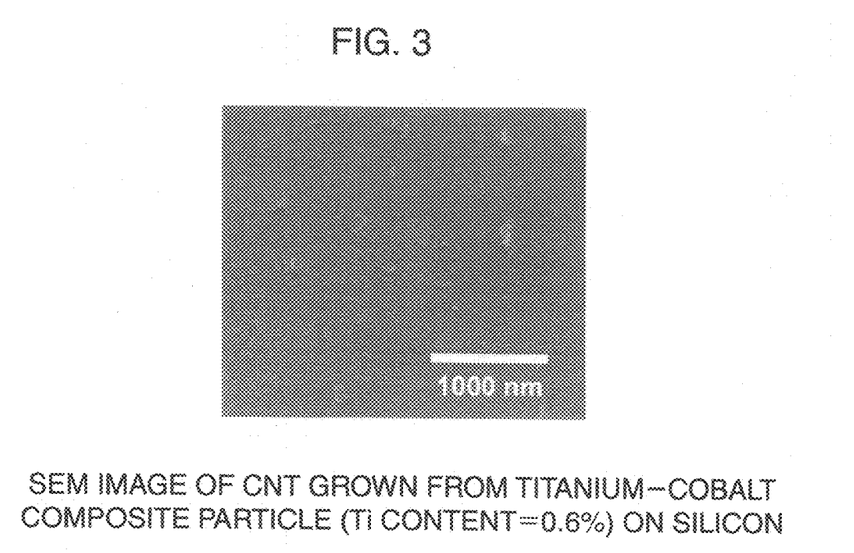
FIG. 3 is a SEM image of CNTs grown from a titanium-cobalt composite particle on a silicon substrate, by adjusting Ti content to 0.6%.
Figure 4:
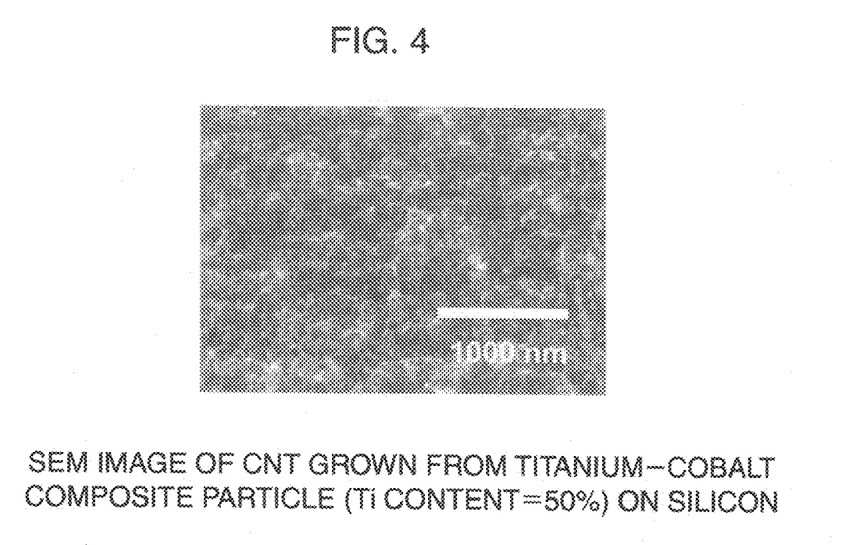
FIG. 4 is a SEM image of CNTs grown from a titanium-cobalt composite particle on a silicon substrate, by adjusting Ti content to 50%.

FIG. 2A shows a scanning electron microscope (SEM) image of CNTs grown from the titanium-cobalt composite particle on the silicon substrate, by adjusting the Ti content to 5%, and FIG. 2B shows a SEM image of CNTs grown from a Ti-free cobalt particle. FIG. 3 is a SEM image of CNTs grown from a titanium-cobalt composite particle on the silicon substrate, by adjusting Ti content to 0.6%, and FIG. 4 is a SEM image of CNTs grown from the titanium-cobalt composite particle on the silicon substrate, by adjusting Ti content to 50%.

It is found from FIG. 2A that CNTs having a uniform length is grown from the titanium-cobalt particle with a uniform high density. On the contrary, FIG. 2B shows no CNT growth from the cobalt particle. Growth rate of CNTs using the cobalt particle as a catalyst is very sensitive to the substrate, and it is often observed that CNTs never grow unless an underlying film is formed on the substrate in a predetermined range of thickness.

It is found from FIG. 3 that CNTs growth is partly observed, but the growth probability apparently reduces from that shown in FIG. 2A, and the CNTs grow sparsely. FIG. 4 shows a higher growth density than FIG. 3 shows, but shows a reducing tendency as compared with FIG. 2A, and also shows a larger number of kinks of the grown CNTs per se.

From the discussion in the above, it was confirmed that the growth probability of CNTs was successfully controlled by adjusting the content of Ti, or a second metal, within a range from 0.5% to 50%.

In the present invention, the substrate allowing the catalyst metal to deposit thereon and underlying material are almost of no importance, because the composite particle per se can fully exhibit a catalytic function for CNTs growth. CNTs growth is made possible typically by depositing the titanium-cobalt composite particle on various substrates such as made of silicon (Si), silicon oxide film ($SiO_2$), tantalum (Ta), molybdenum (Mo) and sapphire. It is even possible to grow CNTs on the air-suspended, titanium-cobalt composite particle, without using the substrate.

Figure 5:
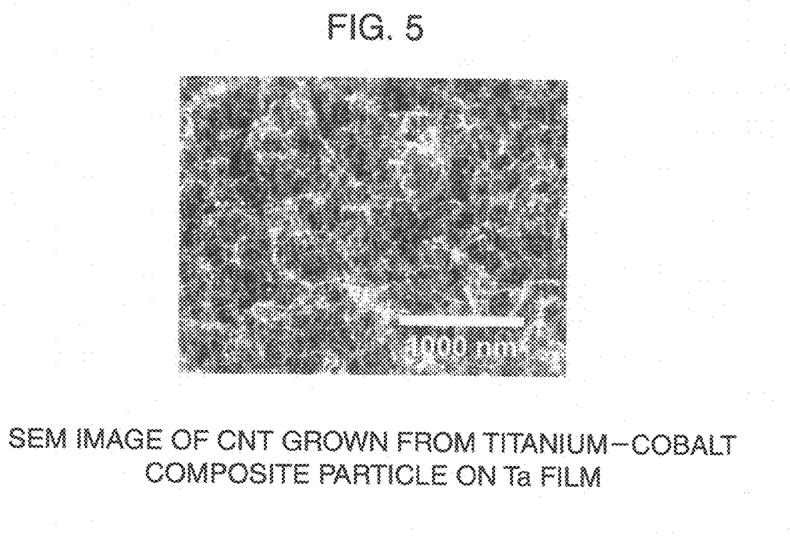
FIG. 5 is a SEM image of CNTs grown from a titanium-cobalt composite particle on a Ta film.

As one exemplary case, FIG. 5 shows a SEM image of CNTs grown from the titanium-cobalt composite particle on a Ta film. It is found from the image that a sufficient level of CNTs growth is observed also from the Ta film. As is clear from the above, use of the titanium-cobalt catalyst particles makes it possible to grow CNTs, in a manner almost independent of the substrate allowing CNTs to grow thereon and underlying material.

The individual metals composing the composite particle may be those other than titanium and cobalt, wherein the first metal may preferably be at least one of iron (Fe) and nickel (Ni), and the second metal may preferably be at least any one selected from tantalum (Ta), molybdenum (Mo), vanadium (V) and copper (Cu). Also for the case where any composite particle composed of the first metal and second metal, other than titanium and cobalt, is prepared, it is made possible to control the growth probability of CNTs by adjusting the ratio of content of the second metal within a range from 0.5% to 50%.

Specific Embodiments Applied with the Present Invention

The following paragraphs will describe specific embodiments of the formed product of CNTs and the method of forming the same applied with the present invention, referring to the attached drawings.

First Embodiment

This embodiment exemplifies a case where CNTs are grown on an insulating film formed on a silicon substrate.

Figure 6A:
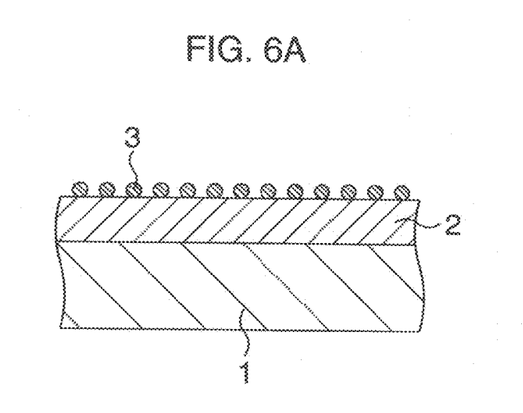
FIGS. 6A and 6B are schematic sectional views showing a method of forming CNTs according to a first embodiment.
Figure 6B:
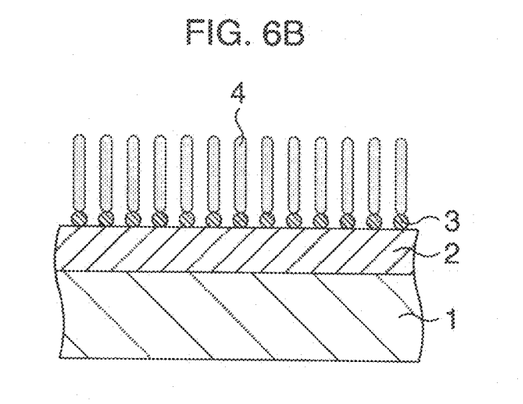

FIGS. 6A and 6B are schematic sectional views showing the method of forming CNTs according to the first embodiment.

First, as shown in FIG. 6A, a silicon substrate 1, for example, having an insulating film 2 such as silicon oxide film formed thereon is obtained, and titanium-cobalt composite particles 3 are deposited on the insulating film 2.

Figure 7:
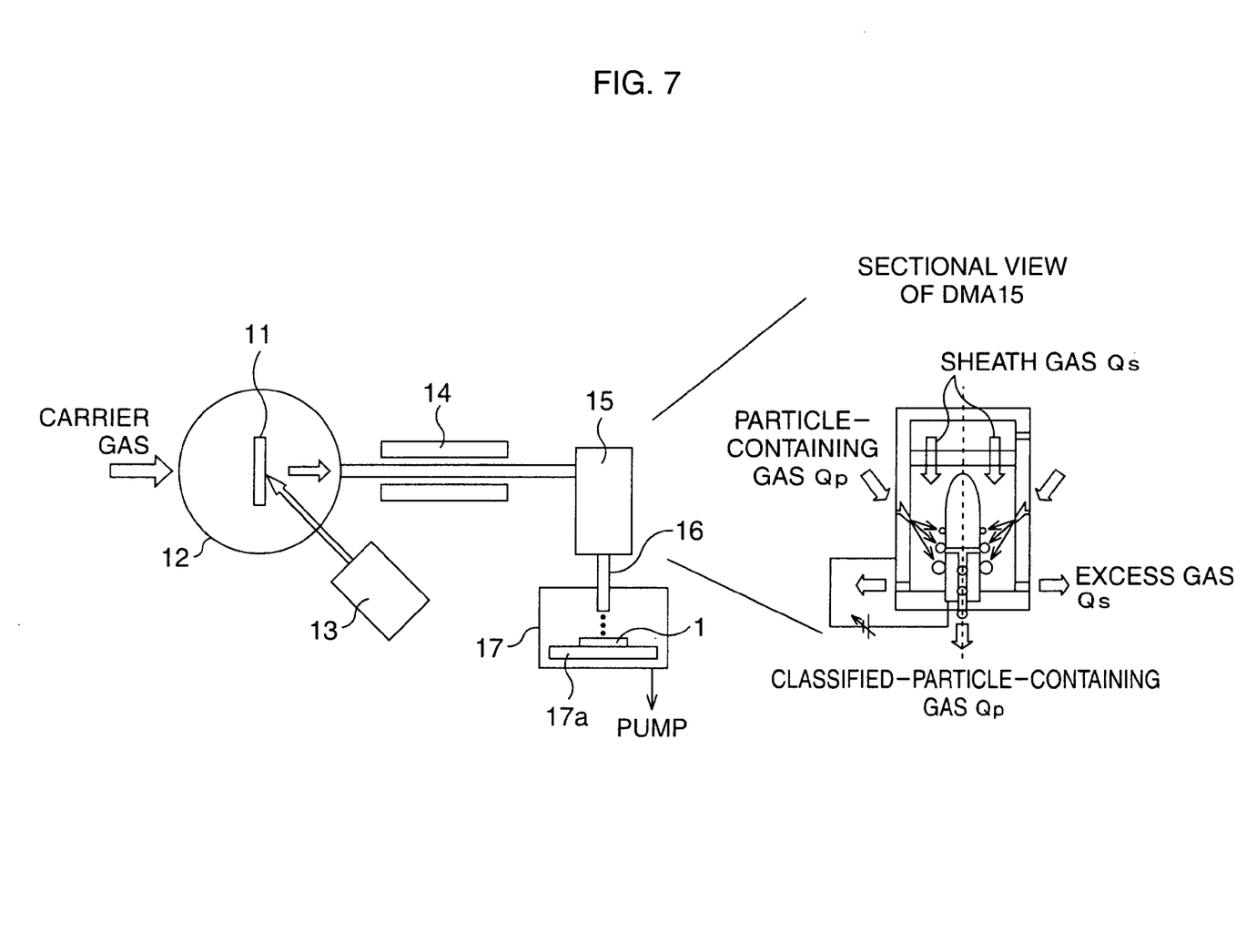
FIG. 7 is a schematic drawing of a catalyst particle production system used in the first embodiment.

More specifically, using a catalyst particle production system shown in FIG. 7, titanium-cobalt composite particles 3 are prepared by the laser ablation process.

The catalyst particle production system is configured as having a chamber 12 in which a target, a titanium-cobalt alloy target 11 herein, is placed, a laser unit 13 irradiating laser light to the titanium-cobalt alloy target 11, an electric furnace 14 annealing the produced particles, a differential mobility analyzer (DMA) 15 classifying the particles by size, a nozzle 16 supplying the titanium-cobalt composite particles 3 produced by the DMA 15, and a deposition chamber 17 having housed therein a mobile stage 17a on which an object of deposition, which is the silicon substrate 1 herein, is placed and held.

The DMA 15 is configured so as to introduce gas Qp containing the particles annealed by the electric furnace 14, with the aid of sheath gas Qs, and so as to select only particles having a predetermined size and allow them to pass therethrough to be supplied through the nozzle 16. The sheath gas is discharged as an excess gas.

First the chamber 12 is conditioned to a pressure of approximately 10 Torr, and a laser light from a second harmonic Nd:YAG laser 13 with a pulse repetition frequency of 20 Hz, for example, is irradiated to the titanium-cobalt alloy target 11 having a Ti:Co atomic ratio of 5:95 (Ti content of 5%). The laser irradiation causes ablation of the titanium-cobalt alloy target 11 and vapor generation. The generated vapor is cooled typically by a carrier gas (He) at a flow rate of 1 slpm (standard liter per minute), and thereby the particles are produced. The particles are then annealed at 1,000° C. or around in the tubular electric furnace 14, and classified by the DMA 15 to thereby adjust the size to as uniform as 5 nm±10%. The titanium-cobalt composite particles 3 thus adjusted in the size are then transferred, with the aid of a pump, through the nozzle 16 typically having an inner diameter of 4 mm or around, and introduced into the deposition chamber 17 kept at a pressure of 10 Torr or around. The silicon substrate 1 is held on the mobile stage 17a in the deposition chamber 17 right under the nozzle 16, and the titanium-cobalt composite particles 3 are deposited on the insulating film 2 formed on the silicon substrate 1 with the aid of inertia or electric field. It is also possible to uniformly deposit the titanium-cobalt composite particles 3 on the insulating film 2 formed on the silicon substrate 1, by appropriately scanning the mobile stage 17a having the silicon substrate 1 placed hereon.

Figure 8:
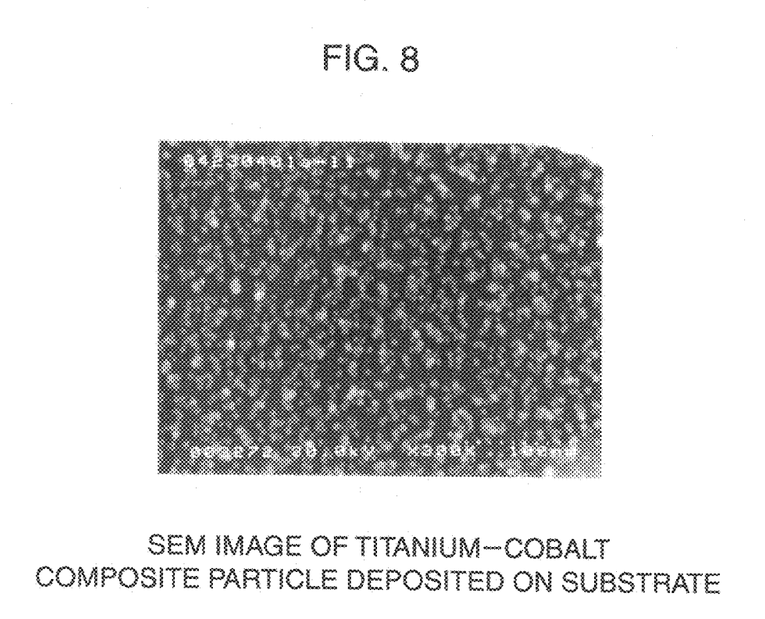
FIG. 8 is a SEM image of titanium-cobalt composite particles deposited by the catalyst particle producing system.

FIG. 8 shows a SEM image of the titanium-cobalt composite particles deposited by the catalyst particle producing system. The titanium-cobalt composite particles herein were deposited on the silicon substrate, while adjusting the ratio of Ti content to 5%. It is found that the titanium-cobalt composite particles are produced as having a uniform size (diameter). By using the catalyst particle producing system, and by varying composition of the titanium-cobalt alloy target, it is made possible to produce the titanium-cobalt particles having various ratios of content and desired size independent of the ratio of content.

Next, as shown in FIG. 6B, CNTs 4 are grown by the CVD process on the titanium-cobalt composite particles 3 deposited on the insulating film 2 formed on the silicon substrate 1, to thereby form a CNT formed product composed of the titanium-cobalt composite particles 3 and CNTs 4.

More specifically, the silicon substrate 1 having formed thereon the insulating film 2 having the titanium-cobalt composite particles 3 deposited thereon is transferred to a CVD chamber, and an acetylene-argon mixed gas (ratio of mixing=1:9) is used as a source gas. Flow rate of the source gas is set to 200 sccm (standard cubic centimeter per minute) and pressure is set to 1 kPa, for example. Temperature of the heating stage having the silicon substrate 1 placed thereon is set to 540° C., and growth period is set to 10 minutes, for example.

According to the above-described process, dense and uniform CNTs 4 can be grown from the titanium-cobalt composite particles 3 deposited on the insulating film 2.

As has been described in the above, use of the titanium-cobalt particles as the catalyst in the present embodiment makes it possible to readily and reliably form CNTs 4 typically on the insulating film 2 such as silicon oxide film, independent of the substrate on which CNTs 4 will be deposited and underlying material.

Second Embodiment

This embodiment exemplifies a case where CNTs are grown in a viahole in a wiring structure of a semiconductor device, to thereby form a viaplug.

Figure 9A:
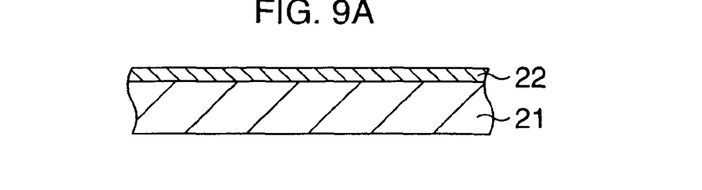
FIGS. 9A to 9C are schematic sectional views showing a method of forming a viaplug according to a second embodiment.
Figure 9B:
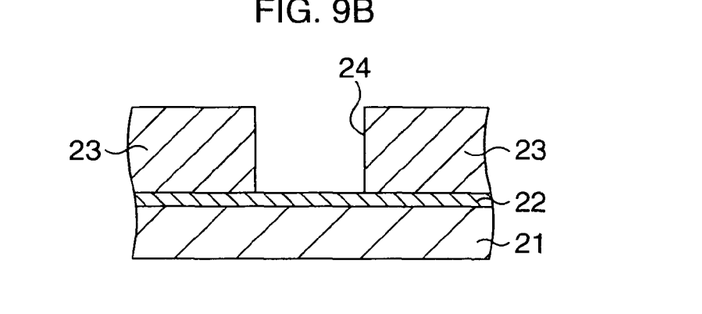
Figure 9C:
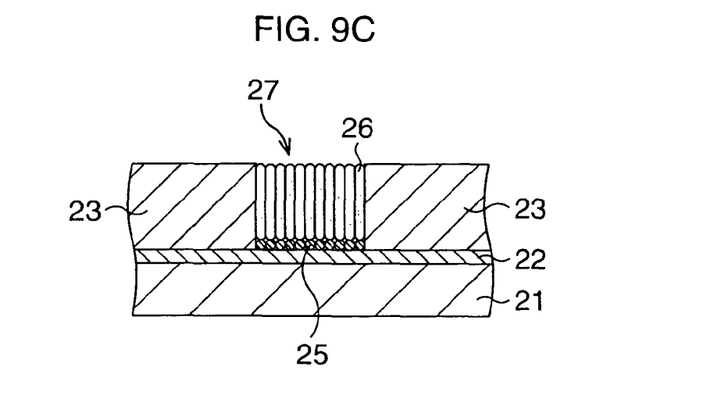

FIGS. 9A to 9C are schematic sectional views showing a method of forming the viaplug according to the second embodiment.

First, an inter-layer insulating film (not shown) is formed on a silicon substrate (not shown), for example, and in the inter-layer insulating film, a lower wiring 21 composed of copper (Cu) is formed typically by the damascene process, as shown in FIG. 9A. Ta is then deposited as a barrier metal on the lower wiring 21 by sputtering, and patterned by photolithography and dry etching, thereby a Ta film 22 is formed so as to cover the lower wiring 21.

Next, as shown in FIG. 9B, an inter-layer insulating film 23 typically composed of silicon oxide film is then deposited over the entire surface typically by the CVD process, and the inter-layer insulating film 23 is patterned to thereby form a viahole 24 so as to expose therein a part of the surface of the Ta film 22.

Next, as shown in FIG. 9C, using the catalyst particle production system shown in FIG. 7, titanium-cobalt composite particles 25 are deposited on the Ta film 22 exposed at the bottom of the viahole 24, and then CNTs 26 are grown from the titanium-cobalt composite particles 25 by the CVD process, so as to fill the viahole 24 with a CNT formed product composed of the titanium-cobalt composite particles 25 and CNTs 26.

By this process, a viaplug 27 filled with a dense and uniform CNTs 26 grown from the titanium-cobalt composite particles 25 on the Ta film 22 is completed.

Figure 10:
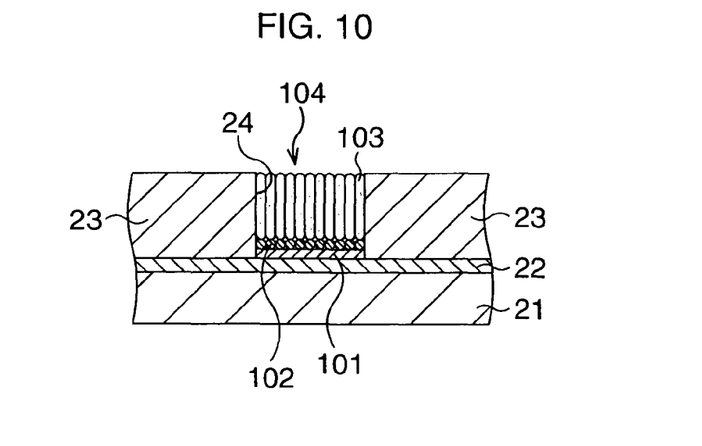
FIG. 10 is a schematic sectional view of a viaplug according to a comparative example of the second embodiment.

A comparative example of this embodiment will now be shown in FIG. 10.

In the comparative example, a Ti film 101 is formed on the Ta film 22 exposed at the bottom of the viahole 24, and cobalt particles 102 are then deposited on the Ti film 101. CNTs 103 are then grown from the cobalt particles 102 by the CVD process so as to fill the viahole 24 with a CNT formed product composed of the cobalt particles 102 and CNTs 103, to thereby complete a viaplug 104.

The titanium film herein is necessary only for growing CNTs using the cobalt particles as the catalyst, and stacking of the titanium film results in an adverse effect of increasing the wiring resistance. In contrast, the present embodiment disuses the Ti film which was essential for CNTs growth in the comparative example, and therefore makes it possible to reduce the number of process steps, and to reduce the wiring resistance to a considerable degree.

As has been described in the above, by using the titanium-cobalt composite particles 25 as the catalyst, the present embodiment makes it possible to readily and reliably form CNTs 26 typically on the Ta film 22, independent of the substrate on which CNTs will be deposited and underlying material.

It is to be understood that the present invention is by no means limited to the first and second embodiments, and it is also allowable, for example, to produce the titanium-cobalt composite particle typically by the so-called the evaporation-condensation process ("Earozoru Yogo-Shu (Glossary of Aerosol)", Edited by Japan Association of Aerosol Science and Technology, published by Kyoto University Press, 2004), in place of the above-described laser abrasion process.

Another possible method may be such as depositing a titanium-cobalt binary film on the substrate typically by sputtering, and annealing the film to thereby produce the titanium-cobalt composite particle. For example, it is allowable to deposit the titanium-cobalt binary film having a Ti content of 5% to a thickness of 1 nm or around on a silicon oxide film, and to anneal at 500° C. or around for refinement. The case is, however, disadvantageous in controllability as compared with the above-described embodiment, because the size and density of the particles depend on species of the substrate and anneal temperature.

What is claimed is:

1. A formed product of a line-structured substance composed of carbon element comprising:
    a substrate made of a single species selected from silicon (Si), silicon oxide ($SiO_2$), tantalum (Ta) and molybdenum (Mo);
    a composite particle formed on the substrate, composed of only a first metal as a catalyst metal, and a second metal adjusting catalytic action of said first metal and controlling a growth probability of a line-structured substance composed of carbon element; and
    a line-structured substance composed of carbon element grown from said composite particle that serves as a nucleus,
    wherein said first metal is cobalt (Co), and said second metal is one or both of vanadium (V) and tantalum (Ta),
    wherein said composite particle and said line-structured substance are united, and
    wherein said composite particle has a content of said second metal of 0.5% to 50%, both ends inclusive.

2. The formed product of a line-structured substance composed of carbon element according to claim 1, wherein said composite particle has a uniform diameter.

3. The formed product of a line-structured substance composed of carbon element according to claim 1, wherein said composite particle is formed with a uniform size as small as 5 nm±10%.

4. A method of forming a line-structured substance composed of carbon element comprising the steps of:
    on a substrate made of a single species selected from silicon (Si), silicon oxide ($SiO_2$), tantalum (Ta) and molybdenum (Mo), forming a composite particle composed of only a first metal as a catalyst metal, and a second metal adjusting catalytic action of said first metal and controlling a growth probability of a line-structured substance composed of carbon element; and
    forming a line-structured substance composed of carbon element as grown on said composite particle, by subjecting said composite particle to treatment for growth of said line-structured substance,
    wherein a formed product of a line-structured substance composed by uniting said composite particle and said line-structured substance is formed,
    wherein said first metal is cobalt (Co), and said second metal is one or both of vanadium (V) and tantalum (Ta), and
    wherein said composite particle is formed while controlling content of said second metal to 0.5% to 50%, both ends inclusive.

5. The method of forming a line-structured substance composed of carbon element according to claim 4, wherein said composite particle is formed by the laser ablation process.

6. The method of forming a line-structured substance composed of carbon element according to claim 4, wherein said composite particle is produced by the evaporation-condensation process.

7. The method of forming a line-structured substance composed of carbon element according to claim 4, wherein said composite particle is produced so as to make the diameter thereof uniform.

8. The method of forming a line-structured substance composed of carbon element according to claim 4, wherein said composite particle is formed with a uniform size as small as 5 nm±10%.

9. A formed product of a line-structured substance composed of carbon element comprising:
    a substrate made of a single species selected from silicon (Si), silicon oxide ($SiO_2$), tantalum (Ta) and molybdenum (Mo);
    an insulating film having a viahole, formed above said substrate; and
    a conductive plug formed in said viahole, wherein said conductive plug has:
    a composite particle formed on the bottom surface of said viahole, composed of only a first metal as a catalyst metal, and a second metal adjusting catalytic action of said first metal and controlling a growth probability of a line-structured substance composed of carbon element; and
    a line-structured substance composed of carbon element grown from said composite particle that serves as a nucleus,
    wherein said first metal is cobalt (Co), and said second metal is one or both of vanadium (V) and tantalum (Ta).

* * * * *